(12) United States Patent
Zhu et al.

(10) Patent No.: US 12,296,360 B2
(45) Date of Patent: May 13, 2025

(54) MATERIAL DEPOSITION METHOD AND MATERIAL DEPOSITION APPARATUS

(71) Applicant: Intel Corporation, Santa Clara, CA (US)

(72) Inventors: Fanyi Zhu, Chandler, AZ (US); Hanyu Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 203 days.

(21) Appl. No.: 17/898,503

(22) Filed: Aug. 30, 2022

(65) Prior Publication Data

US 2024/0066550 A1 Feb. 29, 2024

(51) Int. Cl.
*B05D 3/06* (2006.01)
*B05D 1/12* (2006.01)
*H05K 3/02* (2006.01)

(52) U.S. Cl.
CPC ............... *B05D 3/06* (2013.01); *B05D 1/12* (2013.01); *H05K 3/027* (2013.01); *H05K 2203/107* (2013.01)

(58) Field of Classification Search
CPC .................................... B05D 1/12; B05D 3/06
See application file for complete search history.

(56) References Cited

U.S. PATENT DOCUMENTS

| | | | | |
|---|---|---|---|---|
| 2002/0094382 A1* | 7/2002 | Imai | ........................ | H05K 3/02 427/510 |
| 2008/0230390 A1* | 9/2008 | Cohen | ...................... | C25D 5/22 205/118 |
| 2014/0368804 A1* | 12/2014 | Lafarre | ................ | G03F 7/70733 355/72 |
| 2015/0037513 A1* | 2/2015 | Bi | ............................ | B05D 1/12 427/554 |
| 2015/0270116 A1* | 9/2015 | Honda | .................... | H01J 63/06 427/160 |

FOREIGN PATENT DOCUMENTS

| | | | | |
|---|---|---|---|---|
| CN | 1518100 A | * | 8/2004 | ....... H01L 21/76831 |
| CN | 109365237 A | * | 2/2019 | ............... B05D 1/12 |
| WO | WO-0223107 A2 | * | 3/2002 | ............... F26B 3/283 |
| WO | WO-2007059133 A2 | * | 5/2007 | ........... B05D 3/0209 |
| WO | WO-2013056009 A1 | * | 4/2013 | ............... F21K 9/20 |

OTHER PUBLICATIONS

Machine translation CN1518100A (Year: 2004).*
Machine translation CN109365237A (Year: 2019).*

* cited by examiner

*Primary Examiner* — Jacob T Minskey
*Assistant Examiner* — Wayne K. Swier
(74) *Attorney, Agent, or Firm* — Viering, Jentschura & Partner mbB

(57) ABSTRACT

There may be provided a material deposition method and a material deposition apparatus. The method may include providing a substrate. The method may further include providing a layer of a material in a solid form onto the substrate. The material in the solid form may be loosely interfacing with the substrate. The method may further include irradiating the material in a solid form with a light to melt the material in the solid form to the material in a liquid form at one or more specific areas of the substrate. The method may further include cooling the material in the liquid form to a solidified material on the substrate. The solidified material may form a pattern, at the one or more specific areas of the substrate, that adheres to the substrate.

19 Claims, 11 Drawing Sheets

80 providing a substrate and providing a layer of a material in a solid form onto the substrate such that the layer of the material is loosely interfacing with the substrate irradiating the material in a solid form with a light to melt the material in the solid form to the material in a liquid form which adheres to the substrate cooling the material in the liquid form to a solidified material on the substrate to form one or more patterned structures

FIG. 1

MATERIAL DEPOSITION METHOD AND MATERIAL DEPOSITION APPARATUS

TECHNICAL FIELD

Various aspects of the present disclosure generally relate to a material deposition method and apparatus, and particularly, to a material deposition method and apparatus for forming one or more patterns (e.g., electrical interconnect, contact pad, structure, etc.) on a substrate.

BACKGROUND

Dry processes are conventionally required to remove residual material after a structure (e.g., a through-hole) is formed on a substrate. However, such dry processes are difficult to carry out (e.g., they may present issues in connection with "chucking"). Moreover, such processes may not always lead to an intended or successful result.

Accordingly, there may be a need for a method (e.g., for forming structures) which addresses or overcomes at least the above-mentioned issues.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 1 is a flow chart of a material deposition method, according to various aspects of the present disclosure;

DETAILED DESCRIPTION

Figure 2A:
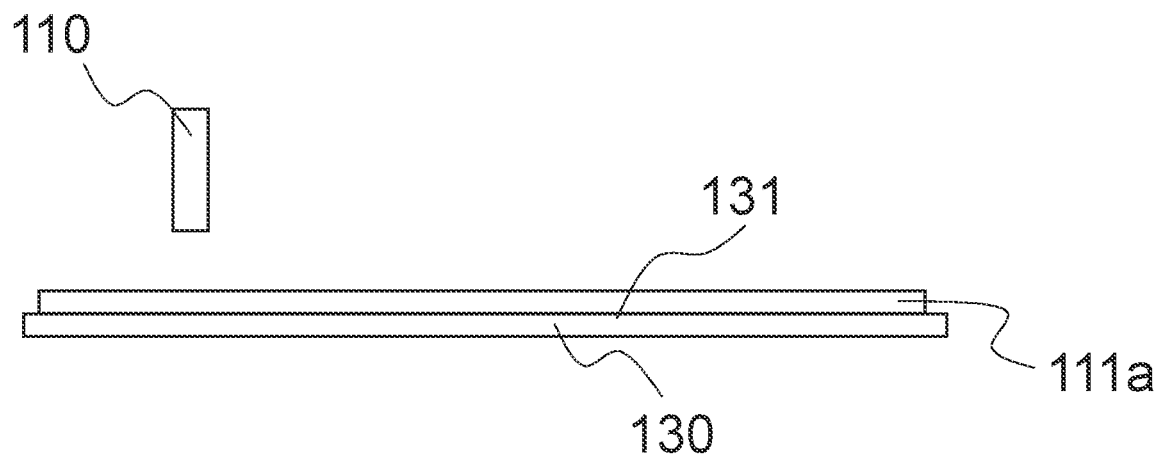
FIG. 2A to FIG. 2F depict schematically the material deposition method of FIG. 1 involving the use of a light-transmissive carrier member, according to various aspects of the present disclosure.
Figure 2B:
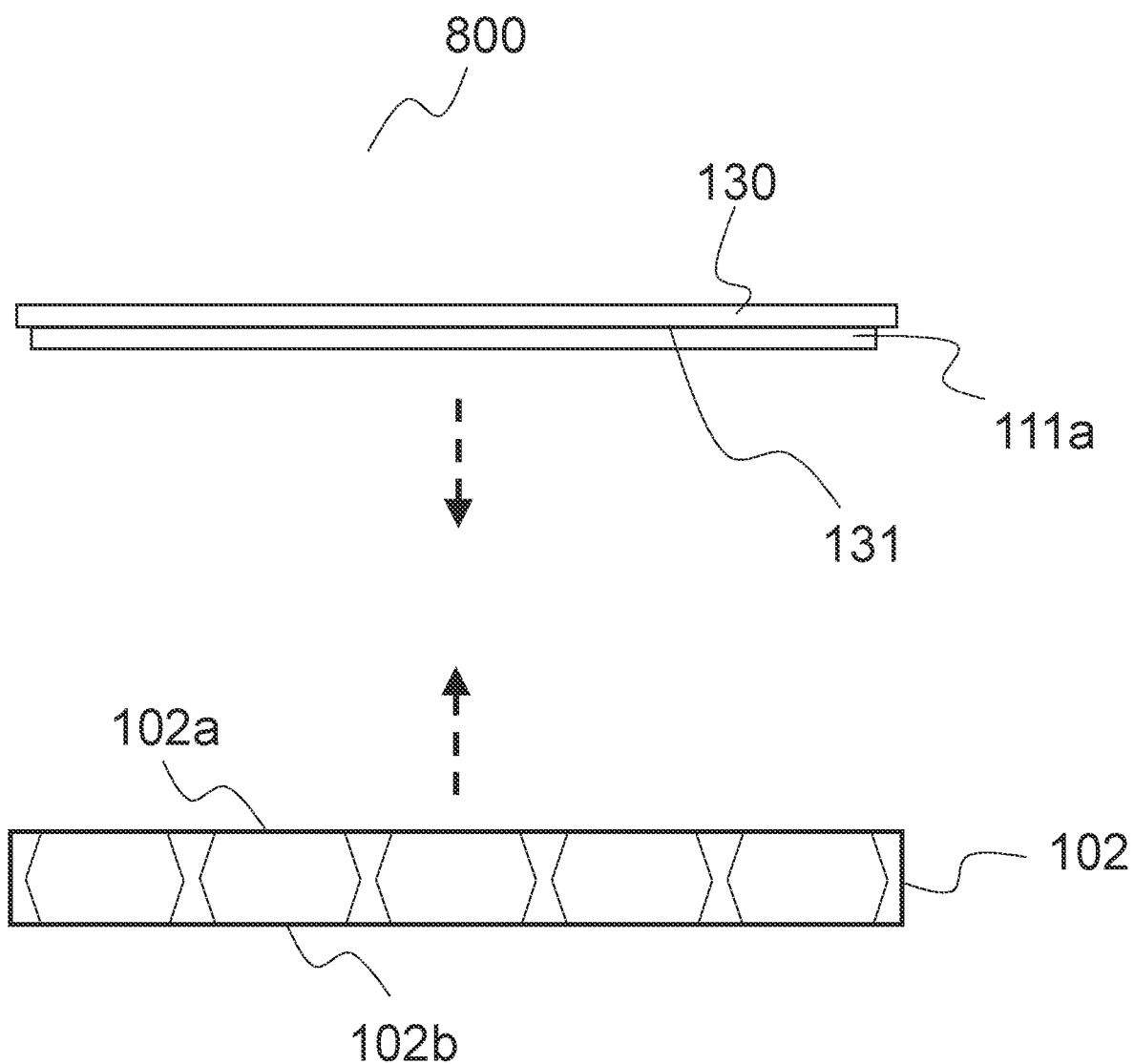

It will be understood that the aspects described below may be combined, for example, a part of one aspect may be combined with a part of another aspect. Further, aspects/description below in the context of the apparatus/device are analogously valid for the respective method, and vice versa.

It should be understood that the terms "on", "over", "top", "bottom", "down", "side", "back", "left", "right", "front", "lateral", "side", "up", "down", etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Various aspects generally describe a method (e.g., material deposition method or structure formation method) which may provide or enable selective deposition of a material on a substrate to form or for forming structure(s) or feature(s) or pattern(s) on the substrate. Such structure(s) or feature(s) or pattern(s) may include metal or metallic structure(s) or feature(s) or pattern(s) (e.g., electrical interconnect, contact pads, etc.) or polymer structure(s) (e.g., a substrate or a structure defining a through-hole for a plated through-hole via).

According to various aspects of the present disclosure, the method may also be used to selective coat a substrate with a material.

The method according to various aspect of the present disclosure may be relatively simple to prepare and perform.

As a first example, an aspect of the method may be referred to as "Laser Induced Forward Transfer (LIFT)". LIFT may include providing a material carrier (which may be referred to as a "donor carrier" or "carrier member"). The donor carrier may be a light-transmissive donor carrier (or light-transmissive carrier member). For example, the donor carrier may be a glass panel. A material (which may be referred to as "donor material") provided in the solid form may be attached as a layer to a side or surface of the donor carrier. The material may be or may include a metal, polymer, or any other suitable material capable of being melted by a light (e.g., a laser beam). The donor carrier may then be brought or moved or transported towards a surface of a substrate until the donor material on the donor carrier is loosely interfacing with the substrate surface. A light source for irradiating the light (e.g., the laser beam or an expanded laser beam) may be provided. A mask (e.g., patterned mask with one or more specific pattern(s)) may be positioned or interposed between the light source and the donor carrier. The light source may emit a light which passes through (e.g., through only) one or more light-transmissive region(s) of the mask to, in turn, be transmitted through the light-transmissive donor carrier so as to become incident on one or more corresponding areas of the donor material. The one or more corresponding areas of the donor material (on which the light is incident) may then be heated by the light so as to melt into a liquid form. The melted donor material (e.g., droplets or liquid) detaches from the donor carrier to "fall" and adhere to the substrate surface. The melted donor material may then be cooled until it solidifies to form one or more densified structure(s) or feature(s) or pattern(s) that is adhered to the substrate surface. After the formation of the one or more densified structure(s) or feature(s) or pattern(s), the donor carrier may be moved (e.g., lifted away) from the substrate to separate the remaining unaltered donor material from the substrate and the one or more densified structure(s) or feature(s) or pattern(s) formed on the substrate.

As another example, an aspect of the method may be referred to as "Selective Laser Melting (SLM)". SLM may include first depositing a plurality (e.g., a layer) of solid powder particulates or particles of the donor material onto a substrate surface to form a powder ped. The powder bed may be loosely interfacing with the substrate surface. A light (e.g., a laser beam or multiple laser beams) may then be irradiated (e.g., simultaneously or sequentially) onto the powder bed at one or more area(s) of the powder bed to selectively melt the plurality of solid powder particulates. The melted powder particulates may coagulate and/or become adhered to corresponding area(s) of the substrate surface, and thereafter, be cooled and solidified to form densified structure(s) or feature(s) or pattern(s) that is adhered to the substrate surface. Thereafter, the remaining unaltered power particulates which are still loosely interfacing with the substrate surface may be removed or cleaned easily from the substrate surface, for example, by sweeping or blowing the powder particulates away from the substrate surface.

According to an aspect of the present disclosure, the method described herein may be carried out within a semiconductor facility, for example, at a full panel level, a sub-panel level and/or at a unit level.

Additionally, various aspects generally describe an apparatus and/or a system (e.g., a material deposition apparatus and/or system) for carrying out or performing the method (e.g., material deposition method or structure formation method) described herein.

The following examples pertain to various aspects of the present disclosure.

Example 1 is a material deposition method. The material deposition method may include providing a substrate. The material deposition method may further include providing a layer of a material in a solid form onto the substrate. The material in the solid form may be loosely interfacing with the substrate. The material deposition method may further include irradiating the material in a solid form with a light to melt the material in the solid form to the material in a liquid form at one or more specific areas of the substrate. The material in the liquid form may adhere to the substrate. The material deposition method may further include cooling the material in the liquid form to a solidified material on the substrate. The solidified material may form a pattern that adheres to the substrate at the one or more specific areas of the substrate In Example 2, the subject matter of Example 1 may optionally include that providing the layer of the material in the solid form onto the substrate may include providing a light-transmissive carrier member with a material-support-surface, first attaching the layer of material in the solid form on the material-support-surface of the light-transmissive carrier member, wherein the material-support-surface faces the substrate, and thereafter positioning the light-transmissive carrier member with the material in the solid form onto the substrate to loosely interface with the substrate.

In Example 3, the subject matter of Example 2 may optionally include that the material in the solid form may be configured to detach from the material-support-surface of the light-transmissive carrier member when the material in the solid form is melted to the material in the liquid form.

In Example 4, the subject matter of Example 3 may optionally include that the material deposition method may further include providing a light source configured to irradiate the light. Further, the material deposition method may include providing a patterned mask positioned between the light-transmissive carrier member and the light source. The patterned mask may include (i) at least one light-transmissive region for allowing the light to be irradiated onto one or more areas of the material in the solid form to melt to the material in the liquid form at the one or more specific areas of the substrate and (ii) at least one light-shielding region for shielding at least one other area of the material from the light such that the shielded at least one other area of the material in the solid form remains attached to the material-support-surface of the light-transmissive carrier member.

In Example 5, the subject matter of Example 4 may optionally include that the material in the solid form includes an electrically conductive material and the substrate includes a pair of electrical contact pads. Further, the patterned mask may be configured to allow the irradiated light passing through the at least one light-transmissive region of the patterned mask to melt a continuous line-shaped area of the material in the solid form to form an electrical interconnect adjoining the pair of electrical contact pads on the substrate.

In Example 6, the subject matter of Example 4 or Example 5 may optionally include that the patterned mask may be configured (e.g., further configured) to allow (e.g., further allow) the irradiated light passing through the at least one light-transmissive region of the patterned mask to melt an annular-shaped area of the material in the solid form to form a contact pad for a plated through-hole via on the substrate.

In Example 7, the subject matter of any one of Examples 4 to 6 may optionally include that the material deposition method may further include separating the light-transmissive carrier member with the remaining material in the solid form from the substrate.

In Example 8, the subject matter of any one of Examples 1 to 7 may optionally include that the material in the solid form includes or is a plurality of powder particles.

In Example 9, the subject matter of any one of Examples 1 to 8 may optionally include that the light is a laser beam.

In Example 10, the subject matter of Example 9 may optionally include that the material in the solid form includes an electrically conductive material and that the substrate includes a pair of electrical contact pads. Further, the material deposition method may include moving the laser beam across the material in the solid form to melt a continuous line-shaped area of the material in the solid form to form an electrical interconnect adjoining the pair of electrical contact pads on the substrate.

In Example 11, the subject matter of Example 10 may optionally include that the material deposition method may further include cooling the continuous line-shaped area of the material in the liquid form to a solidified continuous line-shaped area of the material on the substrate to form the electrical interconnect that adheres to the substrate, and removing the powder particles loosely interfacing with the substrate from the electrical interconnect formed on the substrate.

In Example 12, the subject matter of any one of Examples 9 to 11 may optionally include that the material deposition method may further include moving the laser beam across the material in the solid form to melt an annular-shaped area of the material in the solid form to form a contact pad for a plated through-hole via on the substrate.

In Example 13, the subject matter of Example 12 may optionally include that the material deposition method may further include cooling the annular-shaped area of the material in the liquid form to a solidified annular-shaped area of the material on the substrate to form the contact pad for the plated through-hole via on the substrate, and removing the powder particles loosely interfacing with the substrate from the structure.

In Example 14, the subject matter of any one of Examples 1 to 13 may optionally include that the material includes a metal or a polymer.

Example 15 is a structure formation method. The structure formation method may include providing a substrate including a semiconductor material or an insulating material. The structure formation method may further include providing a layer of a material in a solid form onto a surface of the substrate. The material in the solid form may be loosely interfacing with the surface of the substrate. The structure formation method may further include irradiating one or more areas of the material in the solid form with a laser beam to selectively melt the one or more areas of the material in the solid form to the material in a liquid form at one or more corresponding areas of the surface of the substrate. The material in the liquid form may adhere to the surface of the substrate. Further, the structure formation method may include cooling the material in the liquid form on the surface of the substrate to a solidified material. The solidified material may form one or more patterned structures.

In Example 16, the subject matter of Example 15 may optionally include that the one or more patterned structures includes at least one contact pad and at least one electrical interconnect. The at least one electrical interconnect may be formed after forming the at least one contact pad. Further, the at least one electrical interconnect may be adjoining the at least one contact pad.

In Example 17, the subject matter of Example 15 or Example 16 may optionally include that the structure formation method may include laminating the surface of the substrate with a layer of polymer material after forming the one or more patterned structures.

Example 18 is a material deposition apparatus. The material deposition apparatus may include a substrate stage configured to support a substrate. The material deposition apparatus may further include a material deposition unit configured to provide a layer of a material in a solid form. The material in the solid form may be loosely interfacing with the substrate. The material deposition apparatus may further include a light source configured to irradiate the material in a solid form with a light to melt the material in the solid form to the material in a liquid form at one or more specific areas of the substrate. The material in the liquid form may adhere to the substrate.

In Example 19, the subject matter of Example 18 may optionally include that the material deposition apparatus may include a light-transmissive carrier member with a material-support-surface. The layer of the material in the solid form may be attached on the material-support-surface of the light-transmissive carrier member. Further, the material-support-surface may face or oppose the substrate. Yet further, the material in the solid form may be configured to detach from the material-support-surface of the light-transmissive carrier member when the material in the solid form is melted to the material in the liquid form.

In Example 20, the subject matter of Example 19 may optionally include that the material deposition apparatus may include a patterned mask positioned between the light-transmissive carrier member and the light source. The patterned mask may include (i) at least one light-transmissive region for allowing the light to be irradiated onto one or more areas of the material in the solid form to melt to the material in the liquid form at the one or more specific areas of the substrate and (ii) at least one light-shielding region for shielding at least one other area of the material from the light such that the shielded at least one other area of the material in the solid form remains attached to the material-support-surface of the light-transmissive carrier member.

FIG. 1 is a flow chart of a material deposition method, according to various aspects of the present disclosure.

According to various aspects of the present disclosure, the material deposition method 80 may include providing a substrate 102. The substrate 102 may include at least one insulating material and/or at least one semiconductor material and/or at least one conductive material and/or at least one polymer. According to various aspects of the present disclosure, the substrate 102 may be an integrated structure or single integrated entity composed of one or more materials including at least one non-metal or non-metallic material. For example, the substrate 102 may be or may include a circuit board (e.g., printed circuit board (PCB)), a semiconductor substrate 102, a wafer (e.g., silicon wafer), a glass substrate 102 (or a piece of glass), an organic substrate 102, a ceramic substrate 102, or any other suitable substrate 102. Accordingly, the substrate 102 may include a base 102b (e.g., planar bottom surface) and a top surface 102a (e.g., planar top surface) opposite the base. According to various aspects of the present disclosure, the substrate 102 may further include or define at least one hole (e.g., blind-hole, through-hole) for filling with a via or via contact. According to various aspects of the present disclosure, the at least one hole may be pre-formed on the substrate. Accordingly, according to various aspects of the present disclosure, the substrate 102 may further include at least one inner wall defining the at least one hole.

According to various aspects of the present disclosure, the material deposition method 80 may include (e.g., further include) providing a layer of a material 111a or 111b in a solid form onto the substrate 102. According to various aspects of the present disclosure, the layer of the material 111a or 111b in the solid form may be provided onto the top surface 102a (e.g., planar top surface) of the substrate 102 and/or over or into the at least one hole of the substrate 102 (e.g., when the substrate defines the at least one hole). The material deposition method 80 may include (e.g., further include) providing the material 111a or 111b in the solid form onto the substrate 102 in a manner such that the material 111a or 111b in the solid form is loosely interfacing with the substrate 102. That is, the material 111a or 111b in the solid form may be in physical contact with the substrate 102 (e.g., top surface 102a of the substrate 102 and/or at least one inner wall of the substrate 102) but may be unsecured or unaffixed or unadhered, etc., with respect to or from the substrate 102. Accordingly, the material 111a or 111b in the solid form which loosely interfaces with the substrate 102 may be easily moved (e.g., lifted, shifted, etc.) away from the substrate 102 without any resistance or with minimal or negligible resistance. Hence, the material 111a or 111b in the solid form which loosely interfaces with the substrate 102 may be easily separated or removed from the substrate 102, for example, without requiring any stripping solution, liquid, solvent, etc.

According to various aspects of the present disclosure, the material deposition method 80 may include (e.g., further include) providing a light source 120 or a light-emitting device for irradiating a light. The material deposition method 80 may include (e.g., further include) irradiating the material 111a or 111b in a solid form with the light (e.g., directly onto one or more areas or portions of the material 111a or 111b) to melt the material 111a or 111b (e.g., the one or more areas or portions of the material 111a or 111b) in the solid form to the material in a liquid form at or on one or more specific (e.g., corresponding) areas of the substrate 102. The material 111a or 111b may be or may include a metal material, a polymer material, and/or any other suitable type of material capable of being melted by the light emitted from the light source 120. Accordingly, at least one wavelength of the light may cause (e.g., heat up) the material 111a or 111b in the solid form to melt to the material in the liquid form, when the light is incident (e.g., directly incident) on the material 111a or 111b in the solid form. As an example, the light source 120 may be a laser-emitting device (e.g., a laser diode) and the light may be a laser beam (e.g., a single laser beam or multiple laser beam(s)). Further, as an example, at least one wavelength of the light may be within a range of about 800 nm to about 1200 nm. As another example, at least one wavelength of the light may be within a range of about 400 nm to 600 nm (e.g., 532 nm or green laser).

According to various aspects of the present disclosure, the material 111a or 111b may be configured to adhere to the substrate 102 when the material is in the liquid form on the substrate 102. Accordingly, according to various aspects of the present disclosure, the melted material in the liquid form may adhere to the substrate 102, while remaining (unaltered) material 111a or 111b (i.e., which did not receive any of the light) may remain in the solid form still loosely interfacing with the substrate 102.

According to various aspects of the present disclosure, the material deposition method 80 may include (e.g., further include) cooling the material in the liquid form (i.e., cooling the melted material) to a solidified material on the substrate 102. The solidified material may form a pattern (e.g., a via, electrical interconnect, pad, bump, column or column-like structure, or any other structure, etc.) at the one or more corresponding areas of the substrate 102. In particular, the pattern may be adhered to the substrate 102 at the one or more corresponding areas of the substrate 102.

The remaining (unaltered) material 111a or 111b which did not receive any of the light, and which are still remaining in the solid form loosely interfacing with the substrate 102, may be easily or simply separated or removed (e.g., lifted or shifted) away from the solidified material (i.e., the pattern) on the substrate 102 (e.g., without requiring any stripping solution, liquid, solvent, etc.).

FIG. 2A to FIG. 2F depict schematically the material deposition method of FIG. 1 involving the use of a light-transmissive carrier member 130, according to various aspects of the present disclosure.

According to various aspects of the present disclosure, the material deposition method 80 may include providing a light-transmissive carrier member 130. The light-transmissive carrier member 130 may include a material-support-surface 131 (e.g., a downward-facing or a bottom surface of the light-transmissive carrier member 130) configured to or for holding or attaching the layer of the material 111a in the solid form thereon. The material 111a in the solid form may (e.g., initially or first) be attached to the material-support-surface 131 of the light-transmissive carrier member 130, for example, using an adhesive, or through a physical vapor deposition process (e.g., sputtering), or through a chemical vapour deposition process, etc. The layer of the material 111a in the solid form attached to the material-support-surface 131 of the light-transmissive carrier member 130 may include, but is not limited to including, a uniform or substantially uniform thickness (or uniform cross-sectional side profile). With the layer of the material 111a attached to the material-support-surface 131 of the light-transmissive carrier member 130, the light-transmissive carrier member 130 may be oriented or positioned in a manner such that the material-support-surface 131 opposes (e.g., directly opposes or faces) the substrate 102 (e.g., the top surface 102a of the substrate 102). The light-transmissive carrier member 130 and the substrate 102 may then be brought or moved toward each other (e.g., by moving the light-transmissive carrier member 130 towards the substrate 102, or vice versa, or by moving both the light-transmissive carrier member 130 and the substrate 102 toward each other) so that or until the layer of the material 111a in the solid form (i.e., which is attached to the material-support-surface 131 of the light-transmissive carrier member 130) loosely interfaces with the substrate 102 (e.g., the top surface 102a of the substrate 102). In other words, the material deposition method 80 may include positioning the light-transmissive carrier member 130 with the layer of the material 111a in the solid form onto the substrate 102 in a manner so as to loosely interface the layer of the material 111a in the solid form with the substrate 102. Accordingly, the material 111a in the solid form may be sandwiched or interposed between the substrate 102 and the light-transmissive carrier member 130.

Figure 2C:
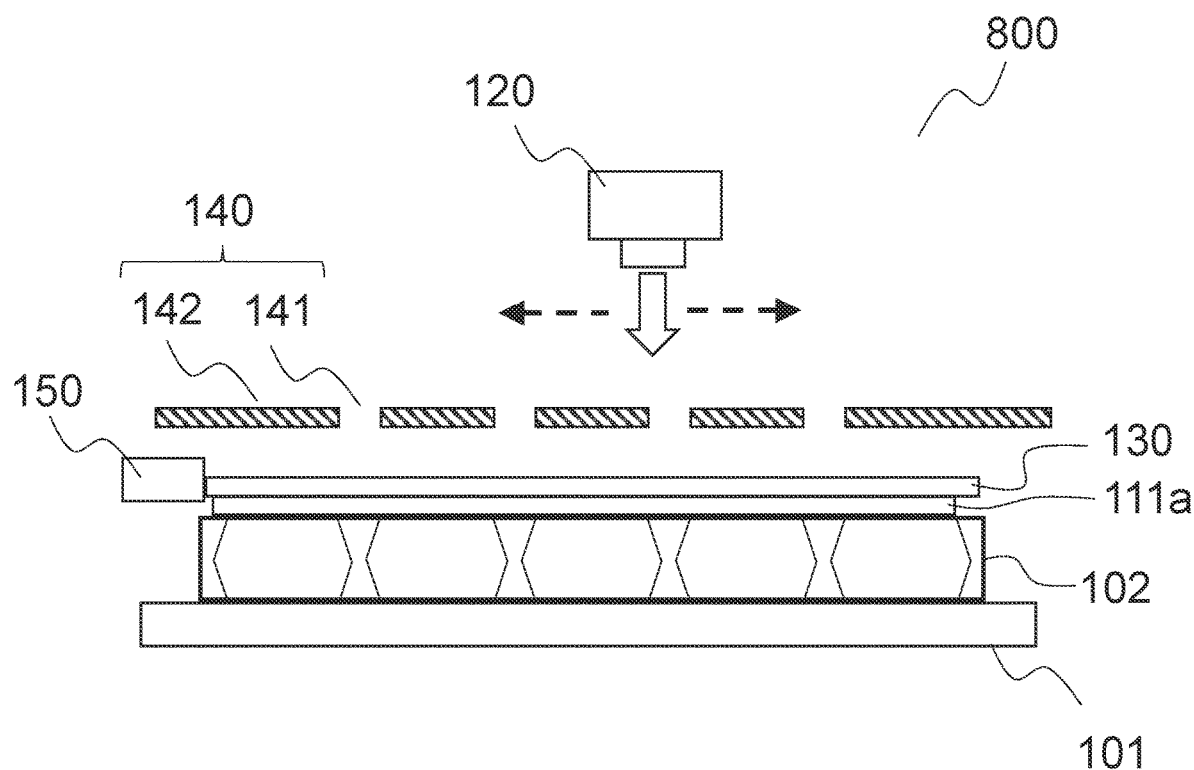

With reference to FIG. 2C, the material deposition method 80 may include (e.g., further include) providing the light source 120 configured to irradiate or emit the light. The light source 120 may, for example, be a laser diode configured to irradiate or emit one or more laser beams. As shown in FIG. 2C, the light source 120 may be positioned opposite (or at an opposite side of) the material-support-surface 131 of the light-transmissive carrier member 130. Accordingly, the light source 120 may be directed towards the light-transmissive carrier member 130.

The light-transmissive carrier member 130 may be configured to allow wavelength(s) of the light emitted from the light source 120, for melting the material 111a in the solid form to the material in the liquid form, to be transmitted through. As an example, the light-transmissive carrier member 130 may be or may include a glass panel.

The light that is allowed to be transmitted through the light-transmissive carrier member 130 may, in turn, be incident on the material 111a in the solid form that is attached to the material-support-surface 131 of the light-transmissive carrier member 130 so as to, in turn, heat up and melt the material 111a in the solid form to the material in the liquid form. The melted material may detach from the material-support-surface 131 of the light-transmissive carrier member 130 and adhere onto the substrate 102.

According to various aspects of the present disclosure, the material deposition method 80 may include (e.g., further include) providing a patterned mask 140. The patterned mask 140 may be positioned or disposed or interposed between (e.g., directly or immediately between) the light source 120 and the light-transmissive carrier member 130. In other words, the material deposition method 80 may include interposing the patterned mask 140 between the light source 120 and the light-transmissive carrier member 130. The patterned mask 140 may include: (i) at least one light-transmissive region 141 for allowing the light to be irradiated onto one or more areas of the material 111a in the solid form to melt (e.g., selectively melt) into the material in the liquid form and (ii) at least one light-shielding region 142 to shield (e.g., selectively shield) at least one other area of the material 111a in the solid from from the light such that the shielded at least one other area of the material 111a in the solid form remains attached to the material-support-surface 131 of the light-transmissive carrier member 130.

Figure 2D:
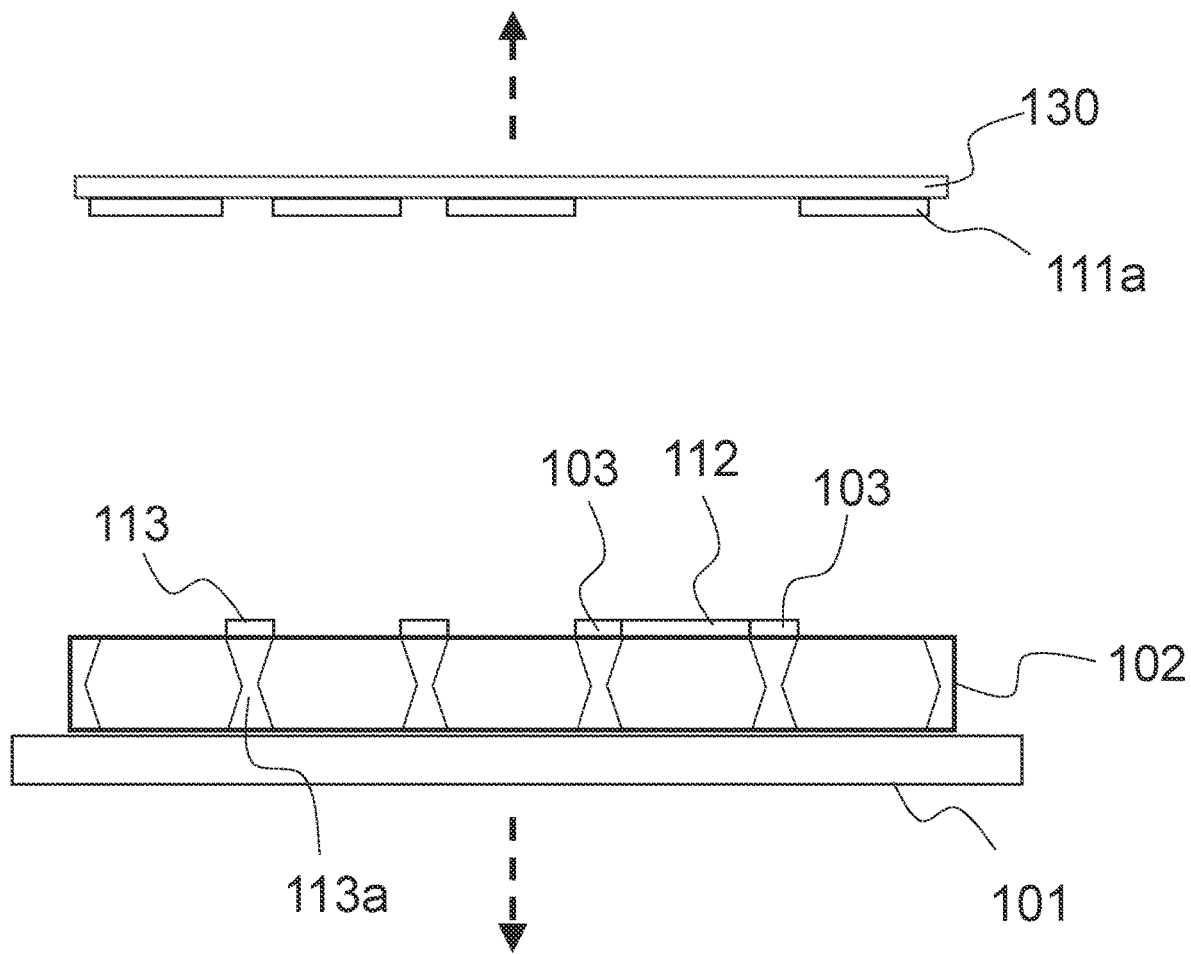
Figure 2E:
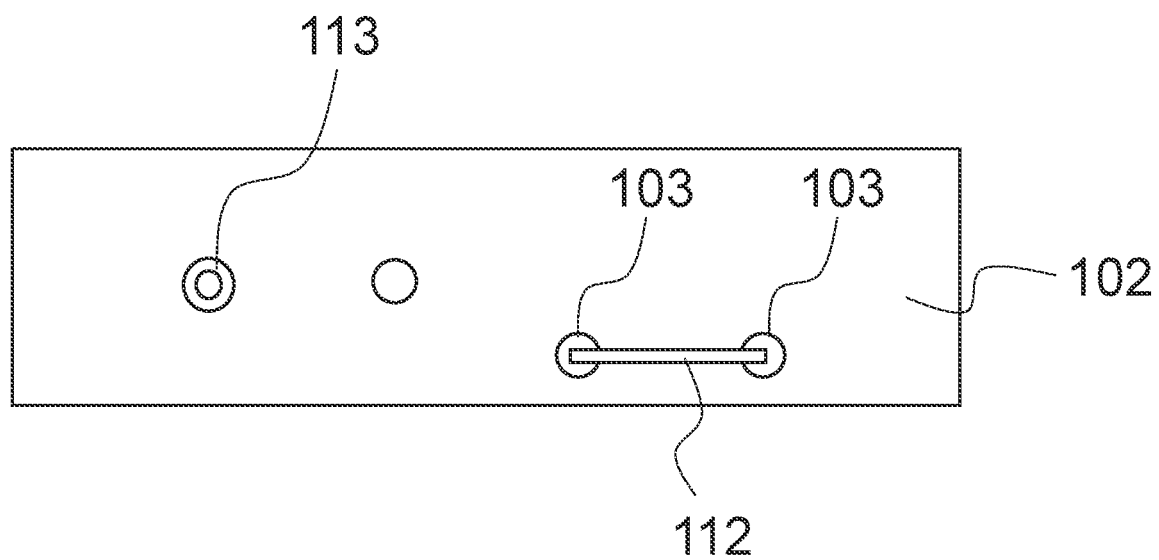

FIG. 2E is a schematic top view of the substrate 102 of FIG. 2D, according to various aspects of the present disclosure.

As an example, with reference to FIG. 2C to 2E, according to various aspects of the present disclosure, the patterned mask 140 may be configured in a manner such that the light passing through or allowed to pass through the at least one light-transmissive region 141 of the patterned mask 140 may irradiate to melt a continuous line-shaped area of the material 111a in the solid form to a corresponding continuous line-shaped (e.g., straight line-shaped and/or curved line-shaped and/or multi-lined shaped) area of the material in the liquid form at a corresponding line-shaped area of the substrate 102. According to various aspects of the present disclosure, the material 111a may be or may include an electrically conductive material (e.g., metal or metallic material, organic polymer or conductive polymer, semiconductor material, etc.). Further, according to various aspects of the present disclosure, the substrate 102 may include a pair of (e.g., at least two, or more) electrical contact pads 103. According to various aspects of the present disclosure, the electrical contact pads 103 may be, but is not limited to being, pre-formed on the substrate 102 (e.g., using the method disclosed herein or any other suitable method). As an example, the substrate 102 may be a circuit board (e.g., PCB) including the pair of electrical contact pads 103. Accordingly, according to various aspects of the present disclosure, the patterned mask 140 may be configured in a manner such that the light passing through the at least one light-transmissive region 141 of the patterned mask 140 may irradiate to melt a continuous line-shaped area of the material 111a in the solid form, adjoining the pair of (or three, or four, etc.) electrical contact pads 103 on the substrate 102 (e.g., circuit board), to a corresponding continuous line-shaped area of the material in the liquid form at a corresponding line-shaped area of the substrate 102 for forming an electrical interconnect 112 between the pair of (or three, or four, etc.) electrical contact pads 103 on the substrate 102 (e.g., circuit board). In other words, the patterned mask 140 may be configured to allow the emitted or irradiated light passing through the at least one light-transmissive region 141 of the patterned mask 140 to melt a continuous line-shaped area of the material 111a in the solid form for forming an electrical interconnect 112 adjoining the pair of (or three, or four, etc.) electrical contact pads 103 on the substrate 102 (e.g., circuit board).

The material deposition method 80 may include (e.g., further include) cooling the continuous line-shaped area of the material in the liquid form to a solidified continuous line-shaped area of the material on the substrate 102 to form the electrical interconnect 112 that may adhere to the substrate 102.

As another example, according to various aspects of the present disclosure, the patterned mask 140 may be configured in a manner such that the light passing through the at least one light-transmissive region 141 of the patterned mask 140 may irradiate to melt an annular-shaped area of the material 111a in the solid form to a corresponding annular-shaped area of the material in the liquid form at a corresponding annular-shaped area of the substrate 102 for forming a contact pad (e.g., annular-shaped contact pad) 113 for a plated through-hole via (e.g., when the material 111a is or includes an electrically conductive material) or for forming a structure defining a through-hole (e.g., extending through the structure) for a via or plated through-hole via (e.g., when the material 111a is or includes a polymer or non-electrically conductive material). In other words, the patterned mask 140 may be configured to allow the irradiated light passing through the at least one light-transmissive region 141 of the patterned mask 140 to melt an annular-shaped area of the material 111a in the solid form at a corresponding annular-shaped area of the substrate 102 for forming a contact pad 113 for a plated through-hole via 113a or for forming a structure defining a through-hole for a via.

The material deposition method 80 may include (e.g., further include) cooling the annular-shaped area of the material in the liquid form to a solidified annular-shaped area of the material on the substrate 102 to form the contact pad 113 for the plated through-hole via 113a, or the structure defining a through-hole for a via, that may be adhered to the substrate 102.

As yet another example, according to various aspects of the present disclosure, the patterned mask 140 may be configured in a manner such that the light passing through the at least one light-transmissive region 141 of the patterned mask 140 may irradiate to melt at least one spot (e.g., circular-shaped or polygonal-shaped area) of the material 111a in the solid form to a corresponding at least one spot of the material in the liquid form at a corresponding at least one spot of the substrate 102 for forming at least one bump, pad (e.g., non-annular contact pad), column or column-like structure, etc., on the substrate 102 (e.g., circuit board). According to various aspects of the present disclosure, the patterned mask 140 may be configured in a manner such that the light passing through the at least one light-transmissive region 141 of the patterned mask 140 may irradiate to melt at least one spot of the material 111a in the solid form to a corresponding at least one spot of the material in the liquid form at a corresponding at least one spot of the substrate 102 for forming a via or plated through-hole via (e.g., the column or column-like structure). For example, the material 111a in the solid form that is melted into the liquid form may flow into a hole of the substrate (e.g., the through-hole of the 'structure defining the through-hole', or a pre-formed hole of the substrate 102) for forming the via or plated through-hole via.

The material deposition method 80 may include (e.g., further include) cooling the at least one spot of the material in the liquid form to a solidified at least one spot of the material on the substrate 102 to form the at least one bump, pad, column or column-like structure, etc., that may be adhered to the substrate 102.

While the patterned mask 140 may be illustrated in FIG. 2C as being a separate entity or component from the light-transmissive carrier member 130, according to another aspect of the present disclosure (not shown), the patterned mask 140 may be integrated within the light-transmissive carrier member 130. For example, according to another aspect of the present disclosure, the light-transmissive carrier member 130 may include or may be further configured with at least one light-shielding region 142.

With reference to FIG. 2D, the material deposition method 80 may include (e.g., further include) separating the light-transmissive carrier member 130 (i.e., with remaining unaltered material 111a in the solid form that is attached to the material-support-surface 131 of the light-transmissive carrier member 130) from the substrate 102, for instance, in particular, after the pattern (e.g., electrical interconnect, via, pad, bump, column or column-like structure, etc.) is formed on the substrate 102.

FIG. 3A to FIG. 3D depict schematically the material deposition material deposition method of FIG. 1 in which the material includes a plurality of powder particles, according to various aspects of the present disclosure.

Figure 3A:
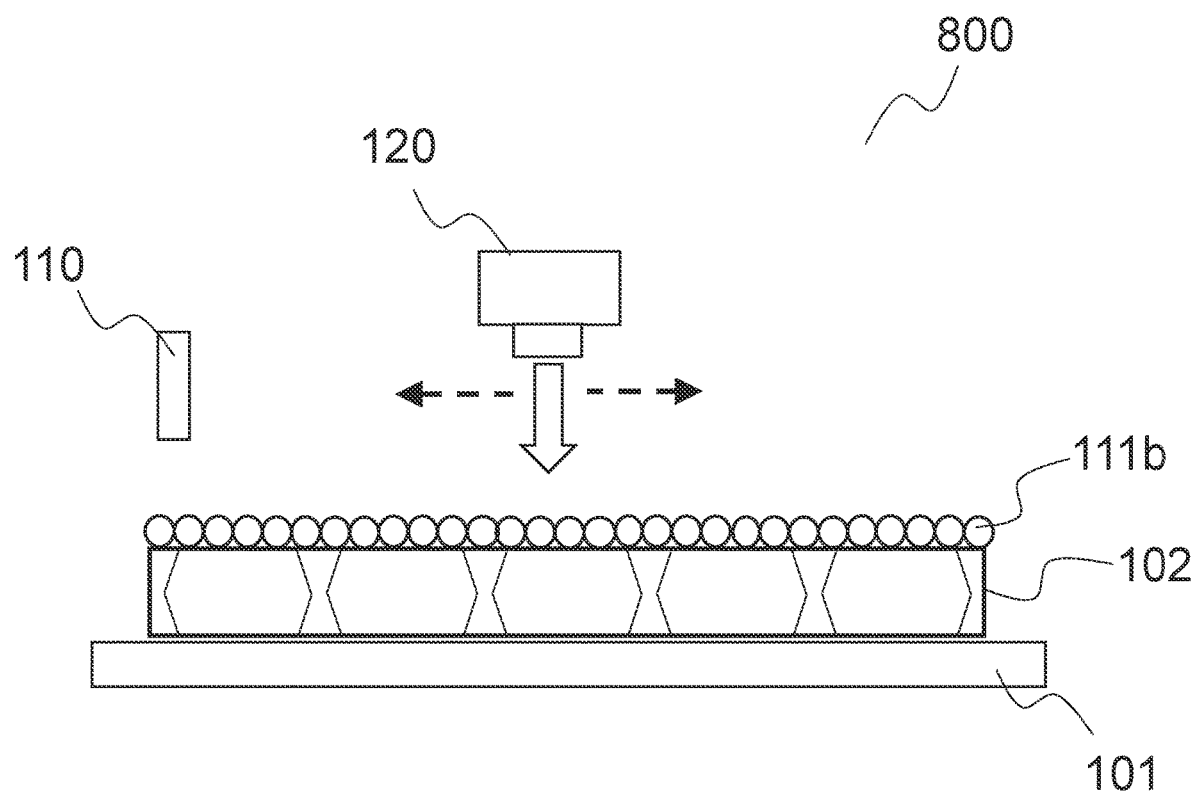
FIG. 3A to FIG. 3D depict schematically the material deposition method of FIG. 1 in which the material includes a plurality of powder particles, according to various aspects of the present disclosure.
Figure 3B:
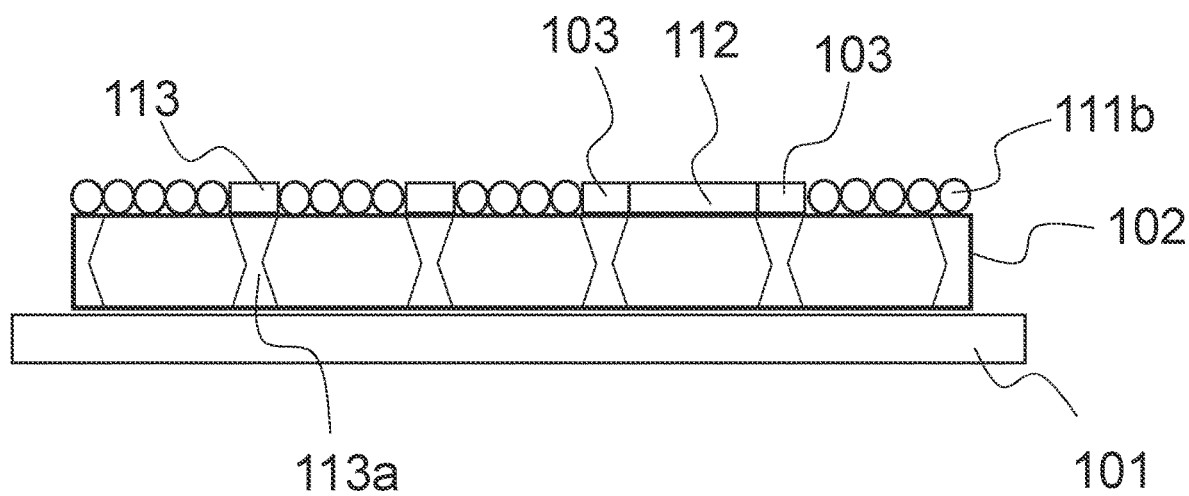
Figure 3C:
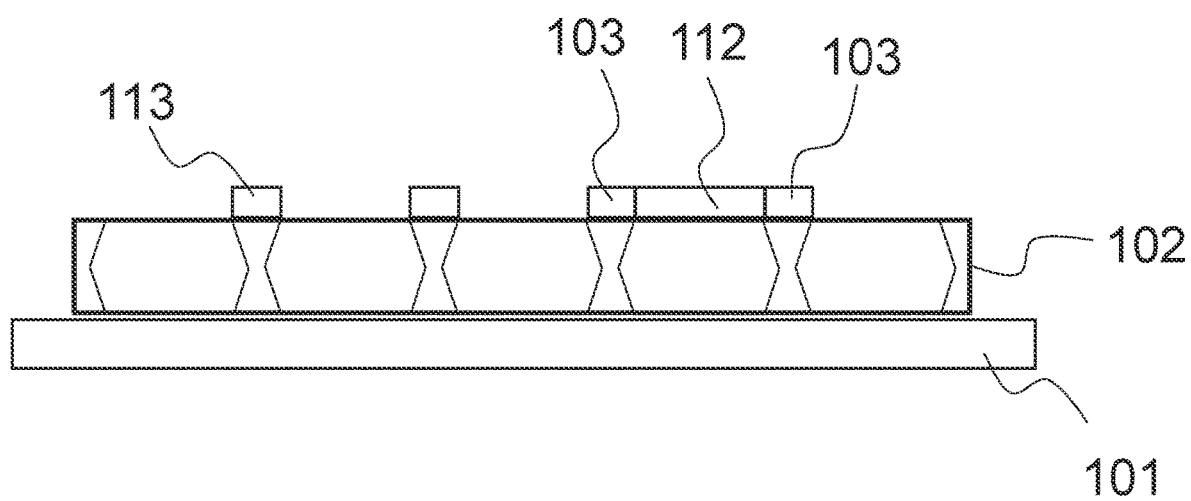

As shown in FIG. 3A, the material 111b in the solid form may be or may include the plurality of powder particles (e.g., disparate power particles).

The plurality of powder particles may be provided or deposited onto the substrate 102. For example, the plurality of powder particles may be provided or deposited manually or by using a material deposition unit or device 110 of a material deposition apparatus 800 (described in detail later), onto a surface (e.g., the top surface 102a) of the substrate 102, to form a powder bed on the surface. According to various aspects of the present disclosure, when the substrate 102 includes or defines at least one hole, the powder bed (e.g., plurality of powder particles) may enter or reach into or inside the at least one hole of the substrate 102. As such, according to various aspects of the present disclosure, the plurality of powder particles may be directly and/or immediately provided or deposited onto the substrate 102 (e.g., without employing the light-transmissive carrier member 130 described with reference to FIG. 2C). The plurality of powder particles provided or deposited onto the substrate 102 (i.e., the powder bed) may be loosely interfacing with the substrate 102. Thus, the surface (e.g., top surface 102*a*) of the substrate 102 on which the plurality of powder particles is deposited may be in a horizontal or substantially horizontal orientation for holding or keeping the plurality of powder particles thereon.

According to various aspects of the present disclosure, the material deposition method 80 may include (e.g., further include) spreading the plurality of powder particles across the substrate 102 to form the powder bed and/or may include levelling the powder bed relative to the substrate 102 (e.g., relative to the top surface 102*a* of the substrate 102), for example, by using a roller or by gliding a straight edge of a levelling device (e.g., straight edge of a blade) across (e.g., horizontally or substantially horizontally across) the plurality of powder particles on the substrate 102. Accordingly, according to various aspects of the present disclosure, the powder bed of the material 111*b* may include, but is not limited to including, a uniform or substantially uniform thickness (or uniform cross-sectional side profile).

According to various aspects of the present disclosure, the material 111*b* may be or may include an electrically conductive material (e.g., metal or metallic material, organic polymer or conductive polymer, semiconductor material, etc.). Further, the substrate 102 may include a pair of (e.g., at least two, or more) electrical contact pads 103. For example, the substrate 102 may be a circuit board (e.g., PCB) which includes the pair of electrical contact pads 103. Accordingly, with reference to FIG. 3A, and as an example, according to various aspects of the present disclosure, the material deposition method 80 may include (e.g., further include) moving the light (e.g., laser, single laser beam, or multiple laser beams) or, in particular, the light source 120 across (e.g., a continuous line-shaped area) of the material 111*b* in the solid form (i.e., the powder bed), adjoining the pair of electrical contact pads 103 on the substrate 102 (e.g., circuit board), to melt the continuous line-shaped area of the material 111*b* in the solid form to a corresponding continuous line-shaped area of the material in the liquid form at a corresponding line-shaped area of the substrate 102 for forming an electrical interconnect 112 between the pair of electrical contact pads 103 on the substrate 102 (e.g., circuit board). In other words, the material deposition method 80 may include moving and/or irradiating the laser beam or laser beams directly onto and/or over and/or across the material 111*b* in the solid form (e.g., by moving the light source or laser diode 120 along a plane when the substrate includes a planar surface, and/or by pivoting the light source 120 when the substrate includes a curvature surface) to melt a continuous line-shaped area of the material 111*b* in the solid form for forming an electrical interconnect 112 adjoining the pair of electrical contact pads 103 on the substrate 102 (e.g., with or without the patterned mask 140 interposed between the light source 120 and the material 111*b*).

The material deposition method 80 may include (e.g., further include) cooling the continuous line-shaped area of the material in the liquid form to a solidified continuous line-shaped area of the material on the substrate 102 (e.g., circuit board) to form the electrical interconnect 112 that adheres to the substrate 102.

The material deposition method 80 may include (e.g., further include), thereafter, separating or removing remaining (unaltered) powder particles which are still loosely interfacing with the substrate 102 (e.g., circuit board) from the electrical interconnect 112 adhered to (i.e., formed on) the substrate 102.

As another example, according to various aspects of the present disclosure, the material deposition method 80 may include (e.g., further include) moving the light (e.g., laser, single laser beam, or multiple laser beams) across (e.g., an annular-shaped area) of the material 111*b* in the solid form (i.e., the powder bed) to melt the annular-shaped area of the material 111*b* in the solid form to a corresponding annular-shaped area of the material in the liquid form at a corresponding annular-shaped area of the substrate 102 (e.g., circuit board) for forming a contact pad 113 for a plated through-hole via 113*a* (e.g., when the material 111*b* is or includes an electrically conductive material) or for forming a structure defining a through-hole for a via or plated through-hole via (e.g., when the material 111*b* is or includes a polymer or non-electrically conductive material). In other words, the material deposition method 80 may include moving and/or irradiating the laser beam or laser beams directly onto and/or over and/or across the material 111*b* in the solid form to melt an annular-shaped area of the material 111*b* in the solid form for forming a contact pad 113 for a plated through-hole via 113*a* or for forming a structure defining a through-hole for a via (or plated through-hole via).

The material deposition method 80 may include (e.g., further include) cooling the annular-shaped area of the material in the liquid form to a solidified annular-shaped area of the material on the substrate 102 to form the contact pad 113 for the plated through-hole via 113*a* or to form the structure defining the through-hole for a via.

The material deposition method 80 may include (e.g., further include) separating or removing remaining (unaltered) powder particles which are still loosely interfacing with the substrate 102 from the contact pad 113 for the plated through-hole via 113*a* or from the structure defining the through-hole for a via, adhered to (i.e., formed on) the substrate 102.

As yet another example, according to various aspects of the present disclosure, the material deposition method 80 may include (e.g., further include) irradiating at least one spot of the material 111*b* in the solid form (e.g., the powder bed) with the light (e.g., laser beam(s)) to melt the at least one spot of the material 111*b* in the solid form to a corresponding at least one spot of the material in the liquid form at a corresponding at least one spot of the substrate 102 for forming at least one bump, pad (e.g., non-annular contact pad), column or column-like structure, etc., on the substrate 102 (e.g., circuit board). According to various aspects of the present disclosure, the material deposition method 80 may include (e.g., further include) irradiating at least one spot of the material 111*b* in the solid form (e.g., the powder bed) with the light to melt the at least one spot of the material 111*b* in the solid form to a corresponding at least one spot of the material in the liquid form at a corresponding at least one spot of the substrate 102 for forming a via or plated through-hole via (e.g., the column or column-like structure). For example, the material 111*b* in the solid form (i.e., plurality of powder particles) may be deposited into or inside a hole of the substrate (e.g., the through-hole of the 'structure defining the through-hole', or a pre-formed hole of the substrate 102) and, thereafter, may be melted by the light into the liquid form which fills the hole for forming the via or plated through-hole via.

The material deposition method 80 may include (e.g., further include) cooling the at least one spot of the material in the liquid form to a solidified at least one spot of the material on the substrate 102 to form the at least one bump, pad, column or column-like structure, etc., on the substrate 102.

The material deposition method 80 may include (e.g., further include) separating or removing remaining (unaltered) powder particles which are still loosely interfacing with the substrate 102 from the at least one bump, pad, column or column-like structure, etc., adhered to (i.e., formed on) the substrate 102.

Figure 2F:
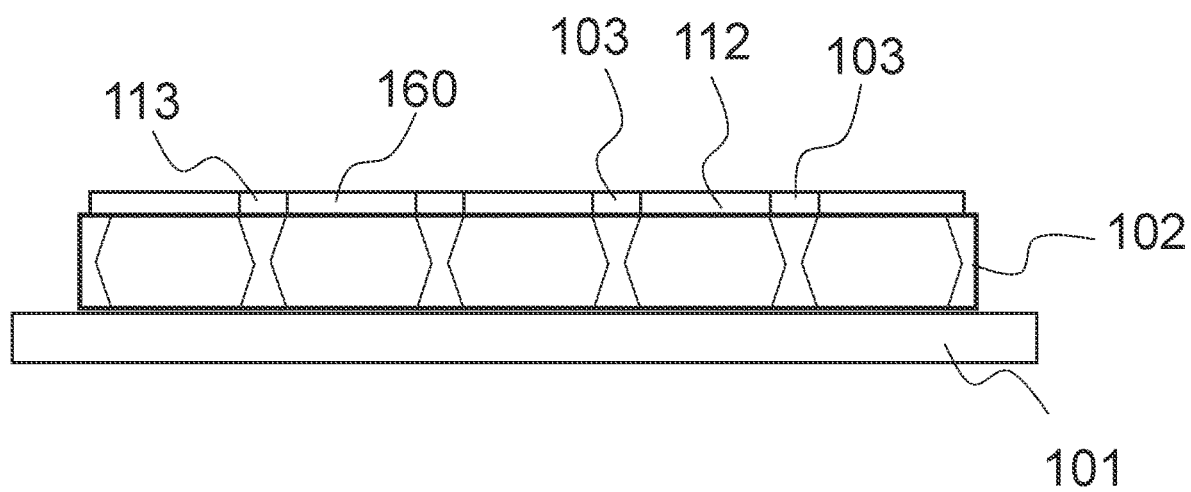
Figure 3D:
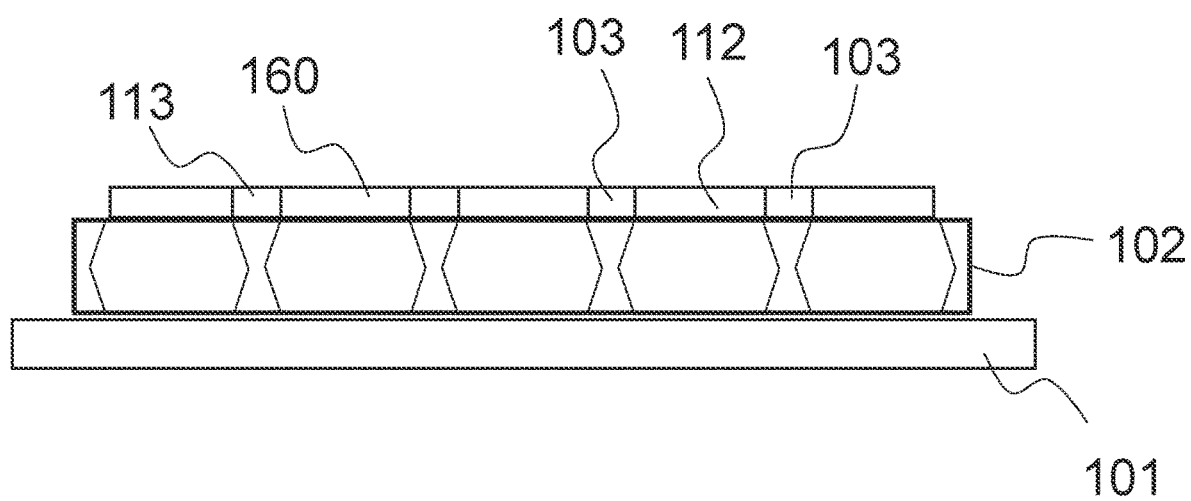

With reference to FIG. 2F and FIG. 3D, according to various aspects of the present disclosure, the material deposition method 80 may include (e.g., further include) laminating the surface of the substrate 102 with a layer of polymer material 160 after the formation of the pattern (e.g., electrical interconnect, bump, pad or contact pad, column or column-like structure, etc.) on the surface of the substrate 102.

Accordingly, according to various aspects of the present disclosure, there may be provided a structure formation method.

The structure formation method may include providing the substrate 102. The substrate 102 may include at least a semiconductor material and/or at least an insulating material. For example, the substrate 102 may be or may include a semiconductor substrate 102, a circuit board, etc.

The structure formation method may include (e.g., further include) providing the layer of the material 111*a* or 111*b* in the solid form onto a surface of the substrate 102. The material 111*a* or 111*b* in the solid form may be loosely interfacing with the surface of the substrate 102.

The structure formation method may include (e.g., further include) irradiating one or more areas of the material 111*a* or 111*b* in the solid form with a laser beam (i.e., the light) to selectively melt the one or more areas of the material 111*a* or 111*b* in the solid form to the material in a liquid form at one or more corresponding areas of the surface of the substrate 102. The material in the liquid form may adhere to the surface of the substrate 102.

The structure formation method may include (e.g., further include) cooling the material in the liquid form on the surface of the substrate 102 to a solidified material. The solidified material may form one or more patterned structures (e.g., electrical interconnect, bump, pad or contact pad, column or column-like structure, etc.), at the one or more corresponding areas of the surface of the substrate 102. The one or more patterned structures formed may be adhered or adhering (e.g., affixed) to the surface of the substrate 102.

According to various aspects of the present disclosure, as an example, the one or more patterned structures may include at least one contact pad 113 and at least one electrical interconnect 112. That is, the structure formation method may include forming at least one contact pad 113 and at least one electrical interconnect 112. In particular, the structure formation method may include forming the at least one electrical interconnect 112 after forming the at least one contact pad 113. Hence, the at least one electrical interconnect 112 may be over and/or adjoining or interfacing the at least one contact pad 113, on the substrate 102.

According to various aspects of the present disclosure, the structure formation method may include (e.g., further include) laminating the surface of the substrate 102 with a layer of polymer material 160 after forming the one or more patterned structures.

It is understood that the structure formation method as described may be compatible with and may include (e.g., further include) any one or more step(s) or process(es) of the material deposition method 80 as described. For example, the structure formation method may include (e.g., further include) using or employing the light-transmissive carrier member 130 to loosely interface the material 111*a* in the solid form with the substrate 102. It is also understood that the material deposition method 80 as described may be compatible with and may include any of the step(s) or process(es) of the structure formation method as described.

Referring to FIG. 2A to FIG. 2F and FIG. 3A to FIG. 3D, according to various aspects of the present disclosure, there may be provided a material deposition apparatus 800 configured to execute or carry out or perform the material deposition method 80 or the structure formation method.

The material deposition apparatus 800 may be a tool or a system or may be a sub-system (in other words, part of a system), for example, within a semiconductor facility.

As shown, the material deposition apparatus 800 may include a substrate stage 101 configured to or for supporting the substrate 102.

The material deposition apparatus 800 may include (e.g., further include) a material deposition unit or device (e.g., material feeder or material dispenser) 110 configured to dispense or provide or deposit the layer of the material 111*a* or 111*b* in the solid form (e.g., directly onto the substrate 102 or onto the light-transmissive carrier member 130).

The material deposition apparatus 800 may include (e.g., further include) the light source 120 (e.g., a laser diode) configured to irradiate the material 111*a* or 111*b* in the solid form with the light (a single laser beam or multiple laser beams) to melt the material 111*a* or 111*b* in the solid form to the material in the liquid form.

The material deposition apparatus 800 may include (e.g., further include) the light-transmissive carrier member 130 including the material-support-surface 131.

According to various aspects of the present disclosure, the material deposition apparatus 800 may include (e.g., further include) the patterned mask 140. The patterned mask 140 may be positioned or disposed or interposed between the light source 120 and the light-transmissive carrier member 130.

The material deposition apparatus 800 may include (e.g., further include) an actuator 150 (e.g., one or more mechanical or robotic arms) configured to or operable to move (e.g., pick and move) any one or more or all of the substrate stage 101, the light-transmissive carrier member 130, the light source 120, and/or the patterned mask 140. For example, the actuator 150 may be configured or configurable to move the substrate stage 101 and/or the light-transmissive carrier member 130 away from or toward each other. As another example, the actuator 150 may be configured to move the patterned mask 140 to be directly between or interposing the light source 120 and the light-transmissive carrier member 130 or to another location so as not to block the light-transmissive carrier member 130 from light emitted from the light source 120 that is directed towards the light-transmissive carrier member 130. It is understood that the substrate stage 101, the light-transmissive carrier member 130, the light source 120, and/or the patterned mask 140 may be moved by any other suitable means.

While the disclosure has been particularly shown and described with reference to specific aspects, it should be understood by those skilled in the art that various changes, modification, variation in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

The invention claimed is:

1. A material deposition method comprising:
   providing a substrate;
   providing a layer of a material in a solid form onto the substrate comprising:
   providing a light-transmissive carrier member with a material-support-surface;
   first attaching the layer of material in the solid form on the material-support-surface of the light-transmissive carrier member, wherein the material-support-surface faces the substrate; and
   thereafter positioning the light-transmissive carrier member with the material in the solid form onto the substrate so that the material in the solid form loosely interfaces with the substrate;
   irradiating the material in a solid form with a light to melt the material in the solid form to the material in a liquid form at one or more specific areas of the substrate, wherein the material in the liquid form adheres to the substrate; and
   cooling the material in the liquid form to a solidified material on the substrate, wherein the solidified material forms a pattern that adheres to the substrate at the one or more specific areas of the substrate.

2. The method of claim 1,
   wherein the material in the solid form is configured to detach from the material-support-surface of the light-transmissive carrier member when the material in the solid form is melted to the material in the liquid form.

3. The method of claim 2, further comprising:
   providing a light source configured to irradiate the light;
   providing a patterned mask positioned between the light-transmissive carrier member and the light source;
   wherein the patterned mask comprises:
   at least one light-transmissive region for allowing the light to be irradiated onto one or more areas of the material in the solid form to melt to the material in the liquid form at the one or more specific areas of the substrate, and
   at least one light-shielding region for shielding at least one other area of the material from the light such that the shielded at least one other area of the material in the solid form remains attached to the material-support-surface of the light-transmissive carrier member.

4. The method of claim 3,
   wherein the material in the solid form comprises an electrically conductive material;
   wherein the substrate comprises a pair of electrical contact pads; and
   wherein the patterned mask is configured to allow the irradiated light passing through the at least one light-transmissive region of the patterned mask to melt a continuous line-shaped area of the material in the solid form to form an electrical interconnect adjoining the pair of electrical contact pads on the substrate.

5. The method of claim 3,
   wherein the patterned mask is configured to allow the irradiated light passing through the at least one light-transmissive region of the patterned mask to melt an annular-shaped area of the material in the solid form to form a contact pad for a plated through-hole via on the substrate.

6. The method of 3, further comprising:
   separating the light-transmissive carrier member with the remaining material in the solid form from the substrate.

7. The method of claim 1,
   wherein the material in the solid form comprises a plurality of powder particles.

8. The method of claim 7,
   wherein the light is a laser beam.

9. The method of claim 8,
   wherein the material in the solid form comprises an electrically conductive material;
   wherein the substrate comprises a pair of electrical contact pads; and
   the method further comprises:
   moving the laser beam across the material in the solid form to melt a continuous line-shaped area of the material in the solid form to form an electrical interconnect adjoining the pair of electrical contact pads on the substrate.

10. The method of claim 9, further comprising:
    cooling the continuous line-shaped area of the material in the liquid form to a solidified continuous line-shaped area of the material on the substrate to form the electrical interconnect that adheres to the substrate; and
    removing the powder particles loosely interfacing with the substrate from the electrical interconnect formed on the substrate.

11. The method of claim 8, further comprising:
    moving the laser beam across the material in the solid form to melt an annular-shaped area of the material in the solid form to form a contact pad for a plated through-hole via on the substrate.

12. The method of claim 11, further comprising:
    cooling the annular-shaped area of the material in the liquid form to a solidified annular-shaped area of the material on the substrate to form the contact pad for the plated through-hole via on the substrate;
    removing the powder particles loosely interfacing with the substrate from the structure.

13. The method of claim 1,
    wherein the material comprises a metal or a polymer.

14. A structure formation method comprising:
    providing a substrate comprising a semiconductor material or an insulating material;
    providing a layer of a material in a solid form onto a surface of the substrate comprising:
    providing a light-transmissive carrier member with a material-support-surface:
    first attaching the layer of material in the solid form on the material-support-surface of the light-transmissive carrier member, wherein the material-support-surface faces the substrate; and
    thereafter positioning the light-transmissive carrier member with the material in the solid form onto the substrate so that the material in the solid form loosely interfaces with the surface of the substrate;
    irradiating one or more areas of the material in the solid form with a laser beam to selectively melt the one or more areas of the material in the solid form to the material in a liquid form at one or more corresponding areas of the surface of the substrate, wherein the material in the liquid form adheres to the surface of the substrate; and
    cooling the material in the liquid form on the surface of the substrate to a solidified material, wherein the solidified material forms one or more patterned structures.

15. The method of claim 14,
wherein the one or more patterned structures comprises at least one contact pad and at least one electrical interconnect;
wherein the at least one electrical interconnect is formed after forming the at least one contact pad;
wherein the at least one electrical interconnect is adjoining the at least one contact pad.

16. The method of claim 14, further comprising:
laminating the surface of the substrate with a layer of polymer material after forming the one or more patterned structures.

17. A material deposition apparatus comprising:
a substrate stage configured to support a substrate;
a material deposition unit configured to provide a layer of a material in a solid form onto a material-support-surface of a light-transmissive carrier member, wherein the material deposition unit is configured to position the material-support-surface so that the material in the solid form faces the substrate and loosely interfaces with the substrate; and
a light source configured to irradiate the material in the solid form with a light to melt the material from the solid form to a liquid form at one or more specific areas of the substrate, wherein the material in the liquid form adheres to the substrate.

18. The material deposition tool of claim 17,
wherein the material in the solid form is configured to detach from the material-support-surface of the light-transmissive carrier member when the material is melted into the material in the liquid form.

19. The material deposition tool of claim 18, further comprising:
a patterned mask positioned between the light-transmissive carrier member and the light source;
wherein the patterned mask comprises:
at least one light-transmissive region for allowing the light to be irradiated onto one or more areas of the material in the solid form to melt to the material in the liquid form at the one or more specific areas of the substrate, and
at least one light-shielding region for shielding at least one other area of the material from the light such that the shielded at least one other area of the material in the solid form remains attached to the material-support-surface of the light-transmissive carrier member.

* * * * *